United States Patent [19]

Sonner et al.

[11] Patent Number: 5,581,201

[45] Date of Patent: Dec. 3, 1996

[54] APPARATUS FOR UNIT CONTROL AND PRESENCE DETECTION

[75] Inventors: David P. Sonner; David A. Brown, both of Austin; Carl W. Kagy, Cedar Park; William J. Watson, Austin, all of Tex.

[73] Assignee: Tandem Computers Incorporated, Cupertino, Calif.

[21] Appl. No.: 538,054

[22] Filed: Oct. 2, 1995

Related U.S. Application Data

[63] Continuation of Ser. No. 269,448, Jun. 30, 1994, abandoned.

[51] Int. Cl.$^6$ .................................................. H03L 5/00
[52] U.S. Cl. ............................ 326/56; 327/333; 326/30
[58] Field of Search .............................. 327/77, 76, 108, 327/333; 326/101, 56–58, 30, 82, 85, 86, 90, 91

[56] References Cited

U.S. PATENT DOCUMENTS

| | | | |
|---|---|---|---|
| 4,151,374 | 4/1979 | Fukuhara et al. | 340/825.94 |
| 4,166,963 | 9/1979 | Metcalf | 326/90 |
| 4,575,714 | 3/1986 | Rummel | 340/568 |
| 4,583,091 | 4/1986 | Sugiura et al. | 340/825.59 |
| 4,612,453 | 9/1986 | Yamazaki | 307/303 |
| 4,697,099 | 9/1987 | Bonaccio | 327/74 |
| 4,831,358 | 5/1989 | Ferrio et al. | 340/825.5 |
| 4,985,641 | 1/1991 | Nagayama et al. | 307/272.3 |
| 5,111,180 | 5/1992 | Suzuki | 340/456 |
| 5,175,764 | 12/1992 | Patel et al. | 379/412 |
| 5,295,132 | 3/1994 | Hashimoto et al. | 370/13 |
| 5,298,795 | 3/1994 | Suzuki et al. | 307/116 |
| 5,304,935 | 4/1994 | Rathke et al. | 324/415 |

Primary Examiner—Timothy P. Callahan
Assistant Examiner—Kenneth B. Wells
Attorney, Agent, or Firm—Townsend and Townsend and Crew LLP

[57] ABSTRACT

A digital control circuit is constructed to use a single signal line for the dual functions of control and sensing the presence of the controlled device. The control circuit includes a driver element having an output capable of being placed in a high impedance allowing the signal line to be pulled to a first predetermined voltage potential when the controlled device is connected thereto, and a second voltage potential when the controlled device is absent therefrom. A receiver circuit monitors the signal line to sense presence of the one or the other of the voltage potentials.

40 Claims, 1 Drawing Sheet

APPARATUS FOR UNIT CONTROL AND PRESENCE DETECTION

This is a continuation of application Ser. No. 08/269,448, filed Jun. 30, 1994, now abandoned.

BACKGROUND OF THE INVENTION

This invention is directed generally to digital systems, and in particular to a technique that allows a single signal line to be used for multiple functions, including the function of detecting the presence of a unit at the receiving end of the signal line.

Today's very large scale integration techniques have achieved amazing success in implementing large amounts of function in extremely small domains. The packaging industry has followed, using such large scale integrated circuits to greatly increase the amount of function carried by or found on a circuit board, or contained in or forming a part of a sub-system, and/or a unit.

While there are a number of obvious advantages flowing from such minimization and packaging techniques, they also give rise to certain problems. One such problem the question of how to communicate with the function of such large scale integrated circuitry, boards, etc. in the sense of the signal lines needed for carrying information. For example, reducing the chip area used for the circuitry that implements the particular function or functions similarly will also reduce the periphery available for signal pins to carry signals to and from the circuitry. One solution has been to use large planar surfaces of the carrier or package containing the actual integrated circuit, but even this surface has a limited amount of room.

This problem is not limited to integrated circuit chip packages; to the contrary, the use of large scale integration can also crowd a large amount of function onto a circuit board or other sub-system package, and the problem of pin limiting is again presented.

SUMMARY OF THE INVENTION

The present invention provides a circuit capable of using a signal line for multiple purposes. Implementation of the invention is simple and inexpensive, making it an ideal solution to pin limitation problems where applicable.

Broadly, the invention is directed to system components that operate to use a communicating signal line to deliver a control signal from a driver circuit to a receiving circuit. Removably connected to a receiving end of the signal line is a system component that includes the receiving circuit. The output of the driver circuit is capable of being placed in a high impedance state, allowing the signal line to assume one of two voltage states that depend upon the presence or absence of the system component at the receiving end of the signal line. Thus, when the output of the driver circuit is not in its high impedance state, the signal line communicates a control signal; when in the high impedance state, the signal line communicates information of whether or not a system component is at the receiving end of the signal line.

In one embodiment of the invention first and second system components are coupled to one another by wiring interconnect that incorporates a plurality of signal lines, including at least one control signal line. The first system component includes the driver circuit, coupled to drive the signal line with a control signal from a driver output that is capable of being placed in a high impedance state. An enable signal, when asserted, permits the driver element to drive the control line, and when not asserted, causes the driver output to assume its high impedance state. The first system component also includes a pull-up resistance coupling the control signal line to a first voltage potential. The receiving end of the signal line has the second system component connected thereto, carrying the receiving circuit and a second resistance that couples the signal line to a second voltage potential. When the driver output is placed in the high impedance state, the presence or absence of the second resistance will cause the control signal line to assume one of two voltage states, thereby indicating the presence or absence of the second system component. The voltage state of the signal line may be sampled at the first system component to thereby determine the presence or absence of the receiver element. The driver may then be returned to an operating state whereby control signals are communicated to the receiver element.

Thus, by the present invention the control signal line is utilized in a manner that allows it to perform two separate functions: (1) to communicate a control signal, and (2) to sense the presence of the second system component carrying the receiving element.

It will be evident that there are a number of advantages obtained by the present invention. First is that what would previously require two signal lines to perform the aforementioned control and sensing functions, now only requires one. Thus, the freed signal line can now be used for other purposes.

These and other advantages will become apparent to those skilled in this art upon a reading of the following detailed description of the invention, which should be taken in conjunction with the accompanying drawings.

DESCRIPTION OF THE PREFERRED EMBODIMENT

Figure 1:
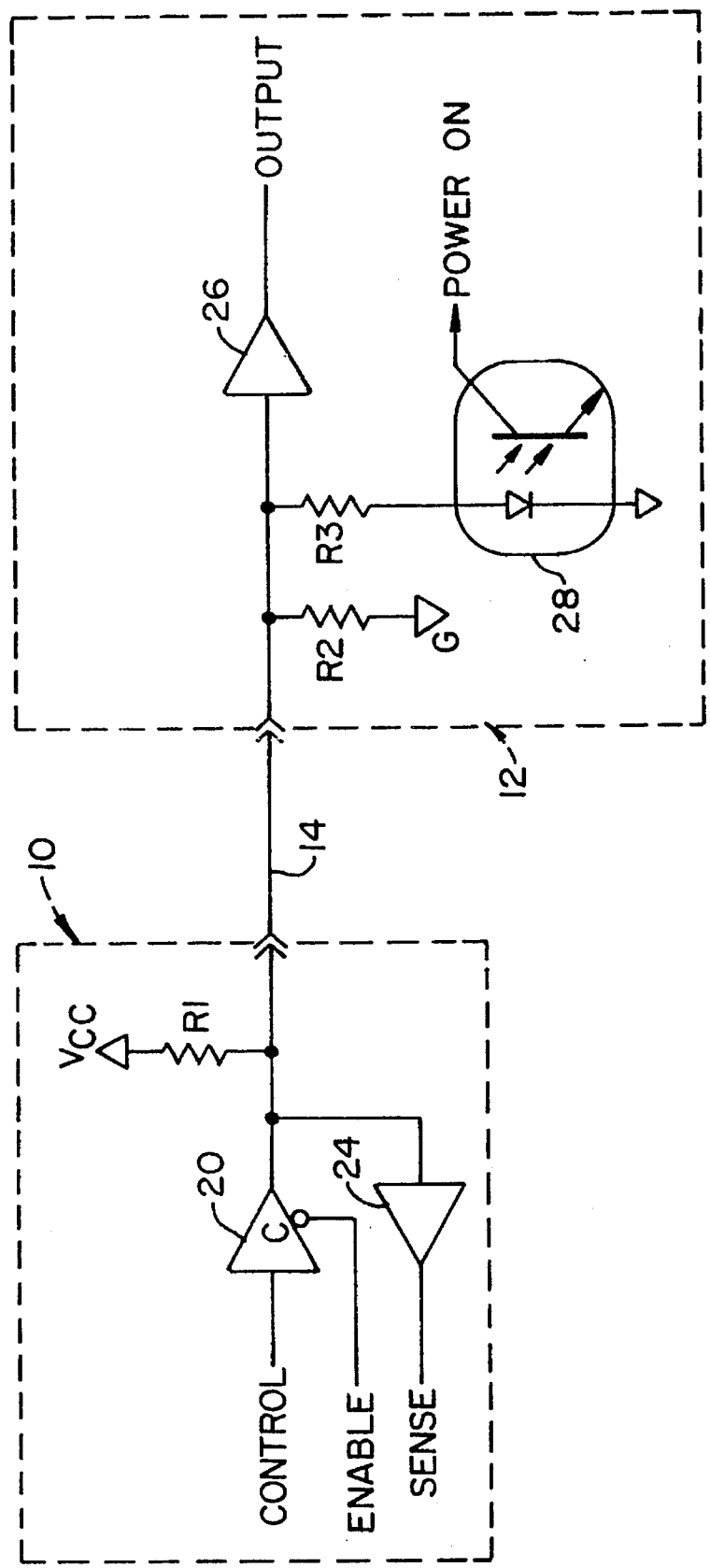
FIG. 1 is a simplified block diagram of the invention, illustrating its operation to (1) drive a controlled unit, and (2) sense that the controlled unit is present at the other end of the driven signal line.

Turning now to FIG. 1, a first system component, designated generally with the reference numeral 10, is shown coupled to a second system component 12, carrying circuits constructed to respond to a signal communicated on a signal line 14 that intercouples the system components 10 and 12. As will be seen, the signal line 14 performs the dual function of communicating control signals from the system component 10 to the system component 12, and of communicating an indication of the presence or absence of the system component 12.

It will be evident to those skilled in this art that the two system components 10 and 12 may take a variety of forms. For example, they may each be integrated circuits mounted on a circuit board and interconnected by printed circuit lines or leads that would at least include the signal line 14 to communicate signals between them. Alternatively, the system components 10, 12, regardless of their particular form, may be located on different circuit boards (not shown), or other mounting apparatus, in which case the signal line 14 represents some form of interconnect, such as a connective back plane assembly or a cable connecting different enclosures, that communicates signals between the circuit boards (and the components 10, 14). As will be seen, the invention does not depend upon the particular environment in which it is used; it is still able to operate to use a single signal line (14) for two functions.

The first system component 10 is shown as carrying a driver device or circuit 20, whose output in coupled to drive the signal line 14, and a buffer circuit 24 connected to receive the signal line 14. A pull-up resistor R1 couples the signal line to a positive (+) voltage or potential.

The second system component 12 is shown as including a receiver circuit 26 coupled to the signal line 14, an opto-coupler 28 that receives the signal line 14 via a resistance R3, and a resistance R2 that couples the signal line 14 to a ground potential G. The opto-coupler 28 operates in response to a control signal (e.g., a logic HIGH or ONE) to develop a "Power On" signal. The Power on signal is, in turn, delivered to power control circuits (not shown) that operate to turn on supply power to the second system component 12 and the circuitry it carries, including the receiver circuit 26.

The resistor values for R1, R2, and R3 are selected so that if the second system component 12 is connected, and the output of the driver element 20 placed in its high impedance state by asserting the ENABLE signal that is applied to its control input (C), a SENSE signal, developed by the buffer circuit 24, will assume a particular logic state, here a logic LOW. Conversely, with the output of the driver element 20 still in its high impedance state, but with the second system component 12 removed from the receiving end of the signal line 14, the SENSE signal will assume another state (e.g., a logic HIGH), indicating the absence of the receiver component 12. A detector circuit (not shown) may be connected to receive the SENSE signal to determine therefrom the presence or absence of the receiving end of the signal line 14, the second system component. Thus, the values of R1 and R2 are selected so that, with the driver element in its high impedance state, the SENSE signal will assume one digital state when the receiver component 12 is present (and operatively connected to the system component 10), and another, different state when the receiver component 12 is absent.

The opto-coupler 28 is not necessarily part of the invention; it is shown here to illustrate that the load exhibited by the receiver component may include resistances that may have to be taken into account when determining the values of the resistances R1 and R2.

With the first system component 10 using a supply voltage (Vcc) of approximately 5 volts DC, the values of the resistances R1, R2, and R3 may be approximately 1 Megohm, 10 Kohms, and 470 ohms, respectively. Thus, with the second system component 12 not connected to the receiving end of the signal line 14, the input of the buffer circuit 24 will be pulled up toward the supply voltage Vcc of the first system component 10 to cause the SENSE signal assume one voltage state that indicates the absence of the second system component. Alternately, if the second system component is connected, the resistance R2 will pull the signal line 12 toward ground potential so the parallel resistance of resistances R2 and R3 cause the SENSE signal to assume another voltage state to indicate that the second system component 12 is connected. In addition, the resistances R1, and R2, and receiver circuit 26 permit control signals to be communicated on the signal line 14 and interpreted as such at the second system component 12.

In use, the detector circuits (not shown) carried by the first system component may first determine the presence or absence of the second system component at the receiving end of signal line 14. Thus, ENABLE signal is asserted to place the output of the driver circuit 20 in its high impedance state. The SENSE signal is viewed, and a determination made, such as by the detector circuits (not component 10, whether or not the second system component 12 is connected. If so, the second system component may need to be powered up, in which case the output of the driver circuit 20 is removed from its high impedance state, and the driver circuit 20 used to drive the signal line 14 with a signal (i.e., a HIGH) that turns on the opto-coupler 28, causing it to develop the Power On signal. In turn, the Power On signal will cause power control circuits (not shown) to apply supply power to the second system component 12, including the receiver circuit 26. Once supply power is applied to the system component 12, the driver element can now be used to drive conventional (depending upon the particular technology used) control signals for receipt by the receiver circuit 26 (that may be coupled onto the second system component 12 for use elsewhere therein).

Anytime the signal line 14 is not being used to communicate control signals from the driver circuit 20 to the second system component 12 and receiver circuit 26, the ENABLE signal can asserted to place the output of the driver circuit 20 in its high impedance state, and allow the SENSE signal to be sampled to determine the presence or absence of the second system component 12. Also, it should be noted that the driver element 20 could be operated to drive the signal line 14 to a high level state before having its output placed in the high impedance state to relieve the system of concerns about the amount of time required for the large resistance (R1) to bring the signal line to a high state.

In summary, therefore, there has been disclosed apparatus that employs a signal line to both deliver various control signalling to a receiving component, and to develop a signal indicative of the presence or absence of the receiving component at the receiving end of the signal line. While a full and complete disclosure has been made of the present invention, those skilled in this art that various modifications and alterations can be made to the disclosed embodiment. For example, although the invention has been disclosed using positive voltages and/or positive logic, it should be readily recognized that other logic conventions, and other voltage levels can also be used. Further, also representative values for the resistors R1, R2, and R3 have been provided, it will be evident to those skilled in this art that a variety of other values may be used to achieve the desired results.

What is claimed is:

1. Apparatus for using a signal line that communicates an operating signal from one electronic unit to another electronic unit to also detect the connection of the another electronic unit to the signal line, comprising:

a driver element, forming a part of the one electronic unit, and having an output that communicates the operating signal to the signal line, the driver element operating to have the output placed in a high impedance state;

a buffer element coupled to the signal line to provide a sense signal indicative of connection of the another electronic unit by presence of a predetermined voltage level on the signal line; and an impedance coupled to a voltage to apply the predetermined voltage level to the signal line when the driver element output is placed in the high impedance state.

2. The apparatus of claim 1, wherein the impedance includes a first impedance element coupled between the voltage and the signal line.

3. The apparatus of claim 2, wherein the voltage is positive.

4. The apparatus of claim 2, wherein the impedance includes a second impedance element that couples the signal line to a voltage potential.

5. The apparatus of claim 4, wherein the voltage potential is less than the voltage.

6. The apparatus of claim 5, wherein the voltage potential is a ground potential.

7. The apparatus of claim 2, wherein the first impedance element is a resistance.

8. The apparatus of claim 2, wherein the first impedance element is a resistance of approximately one megohm.

9. The apparatus of claim 4, wherein the first and the second impedance elements are each a resistance.

10. The apparatus of claim 4, wherein the one, the first, and the second impedances are resistances.

11. The apparatus of claim 4, wherein the first impedance element is a resistance having a value of approximately one megohm and the second impedance element is a resistance having a value of approximately ten Kohms.

12. The apparatus of claim 1, wherein the predetermined voltage level is a positive voltage.

13. Apparatus for using a signal line to communicate an operating signal from a first component coupled to the signal line to a second electronic component coupled to the signal line and to provide a sense signal indicative of the second component not being coupled to the signal line, the apparatus comprising:

the first component including a driver element and a receiver, the driver element having an output that communicates the operating signal to the signal line, the driver element operating to have the output selectively placed in a high impedance state;

the buffer element being coupled to the signal line to provide the sense signal indicative of the second component not being coupled to the signal line when a predetermined voltage level is present on the signal line; and a first impedance and a second impedance coupled to the signal line for applying the predetermined voltage level thereto when the driver element output is placed in a high impedance state, the first impedance being coupled to a first voltage, and the second impedance being in series connection with the first impedance and coupled to a second voltage that is less in magnitude than the first voltage.

14. The apparatus of claim 13, wherein the first impedance is a resistance.

15. The apparatus of claim 14, wherein the second resistance is a resistance.

16. The apparatus of claim 13, wherein the first impedance is a resistance of approximately one megohm, and the second impedance is a resistance of approximately 10 K ohms.

17. The apparatus of claim 15, wherein the second voltage is a ground potential.

18. The apparatus of claim 17, wherein the first voltage is positive.

19. A method for using a signal line to communicate an operating signal from a first component to a second component and to detect a connection of the second component to the signal line, the method including the steps of:

providing a driver element having an output coupled to the signal line;

operating the driver element in a first mode to communicate the operating signal from the output to the signal line, and in a second mode in which the output is placed in a high impedance state;

providing a buffer element coupled to the signal line to provide an output sense signal indicative of presence of a predetermined voltage level on the signal line when the second component is not connected to the first component by the signal line; and applying the predetermined voltage level to the signal line when the driver element output is placed in the high impedance state.

20. The method of claim 19, wherein the applying step includes providing an impedance to couple the voltage level to the signal line.

21. The method of claim 20, wherein the impedance comprises a first resistance to couple the voltage level to the signal line.

22. The method of claim 21, wherein the impedance includes a second resistance.

23. The method of claim 22, wherein the first resistance is coupled between a supply voltage and the signal line, and the second resistance is coupled between the signal line and a ground potential.

24. The method of claim 23, wherein the supply voltage is a positive voltage.

25. Apparatus for using a signal line to communicate a signal from a first component connected to a second electronic component and to provide an indication that the second component is not connected to receive the signal, the apparatus comprising:

a driver element having an output coupled to the signal line, the driver element operating in a first mode to communicate the signal from the output to the signal line and in a second mode in which the output is in a high impedance state;

a receiver coupled to the signal line to provide the indication when a predetermined voltage level is present on the signal line; and a first impedance coupled to a first voltage and to the signal line to apply the predetermined voltage level to the signal line when the output is placed in the high impedance state, the first impedance being coupled between the first voltage and the signal line, and a second impedance coupled between the signal line and a second voltage that is less in magnitude than the first voltage.

26. The apparatus of claim 25, wherein the first voltage is positive.

27. The apparatus of claim 26, wherein the second voltage is a ground potential.

28. The apparatus of claim 1, wherein the one electronic unit includes the receiver.

29. Apparatus for determining that a first component is communicatively coupled by a signal line to a second component, comprising:

a driver included with the first component and having an output coupled to the signal line to communicate an operating signal thereon, the driver element operating to have the output selectively placed in a high impedance state;

a receiver included with the first component and coupled to the signal line to provide a sense signal when a predetermined voltage level is present one the signal line; and an impedance coupled to a first voltage and to the signal line to provide the predetermined voltage level to the signal line when the driver element output is placed in a high impedance state and the second component is not communicatively coupled to the signal line.

30. The apparatus of claim 29, wherein the impedance includes a first impedance coupled to the first voltage, and a second impedance in series connection with the first impedance coupled to a second voltage that is less in magnitude than the first voltage.

31. The apparatus of claim 29, wherein the predetermined voltage is positive.

32. The apparatus of claim 30, wherein the first voltage is positive.

33. The apparatus of claim 30, wherein the second voltage is approximately a ground potential.

34. A method of using a signal line to communicate an operating signal from a first component to a second component and to detect the second component being operatively coupled to the signal line, the method including the steps of:

operating a driver element, having an output coupled to the signal line, in a first mode to communicate the control signal to the signal line, and in a second mode in which the output is placed in a high impedance state;

when the output of the driver element is in the high impedance state, detecting at the first component a first voltage level on the signal line indicative of the second component being operatively coupled to the signal line, and detecting a second voltage level indicative of the second component not being operatively coupled to the signal line.

35. Apparatus for using a signal line to communicate an operating signal from one electronic unit to another electronic unit and to detect the another electronic unit is communicatively connected to the signal line, the apparatus comprising:

the one electronic unit including a driver element having an output that communicates the operating signal to the signal line, the driver element operating to have the output placed in a high impedance state;

an impedance coupled to the signal line and to a voltage to apply a first voltage level to the signal line indicative of communicative connection of the another electronic unit to the signal line and to apply a second voltage level indicative of no communicative connection of the second electronic unit to the signal line when the driver element output is placed in the high impedance state; and means for sensing the first or second voltage levels.

36. The apparatus of claim 35, wherein the first electronic component includes the means for sensing.

37. The apparatus of claim 35, wherein the voltage is positive.

38. Apparatus for using a signal line that communicates an operating signal from one electronic unit to another electronic unit to also detect the connection of the another electronic unit to the signal line, comprising:

a driver element, forming a part of the one electronic unit, and having an output that communicates the operating signal to the signal line, the driver element operating to have the output placed in a high impedance state;

a buffer element coupled to the signal line to provide a sense signal indicative of connection of the another electronic unit by presence of a predetermined voltage level on the signal line; and an impedance coupled to a voltage to apply the predetermined voltage level to the signal line when the driver element output is placed in the high impedance state, the impedance including a first impedance element coupled between the voltage and the signal line and a second impedance element that couples the signal line to a voltage potential.

39. A method for using a signal line to communicate an operating signal from a first component to a second component and to detect a connection of the second component to the signal line, the method including the steps of:

providing a driver element having an output coupled to the signal line;

operating the driver element in a first mode to communicate the operating signal from the output to the signal line, and in a second mode in which the output is placed in a high impedance state;

providing a buffer element coupled to the signal line to provide an output sense signal indicative of presence of a predetermined voltage level on the signal line; and providing an impedance to couple the predetermined voltage level to the signal line when the driver element output is placed in the high impedance state and the second component is not coupled to the signal line, the impedance comprising a first resistance to couple the voltage level to the signal line and a second resistance.

40. Apparatus for determining that a first component is communicatively coupled by a signal line to a second component, comprising:

a driver included with the first component and having an output coupled to the signal line to communicate an operating signal thereon, the driver element operating to have the output selectively placed in a high impedance state;

a buffer included with the first component and coupled to the signal line to provide a sense signal when a predetermined voltage level is present on the signal line; and an impedance coupled to a first voltage and to the signal line to provide the predetermined voltage level to the signal line when the driver element output is placed in a high impedance state and the second component is not communicatively coupled to the signal line;

wherein the impedance includes a first impedance coupled to the first voltage, and a second impedance in series connection with the first impedance coupled to a second voltage that is less in magnitude than the first voltage.

* * * * *

UNITED STATES PATENT AND TRADEMARK OFFICE
CERTIFICATE OF CORRECTION

PATENT NO.   : 5,581,201
DATED        : December 3, 1996
INVENTOR(S)  : David P. Sonnier, et al It is certified that error appears in the above-indentified patent and that said Letters Patent is hereby corrected as shown below:

On the title page, item [19] and [75], Inventors: "Sonner" should read -- Sonnier --, and "David P. Sonner" should read -- David P. Sonnier --.

Signed and Sealed this

Fourth Day of March, 1997

Attest:

BRUCE LEHMAN

*Attesting Officer*     *Commissioner of Patents and Trademarks*